United States Patent
Sridharamurthy et al.

(10) Patent No.: US 10,267,636 B1
(45) Date of Patent: Apr. 23, 2019

(54) METHOD TO TEST THE QUALITY FACTOR OF A MEMS GYROSCOPE AT CHIP PROBE

(71) Applicant: mCube, Inc., San Jose, CA (US)

(72) Inventors: Sudheer S. Sridharamurthy, Milpitas, CA (US); Tony Maraldo, San Jose, CA (US); Zheng-Yao Sun, San Jose, CA (US); Wenhua Zhang, San Jose, CA (US); Te-Hsi Terrence Lee, San Jose, CA (US); Sanjay Bhandari, San Jose, CA (US); Joseph Rastegar, San Jose, CA (US)

(73) Assignee: mCube, Inc., San Jose, CA (US)

( * ) Notice: Subject to any disclaimer, the term of this patent is extended or adjusted under 35 U.S.C. 154(b) by 167 days.

(21) Appl. No.: 14/987,685

(22) Filed: Jan. 4, 2016

Related U.S. Application Data

(60) Provisional application No. 62/099,413, filed on Jan. 2, 2015.

(51) Int. Cl.
*G01C 19/5684* (2012.01)
*B81C 99/00* (2010.01)

(52) U.S. Cl.
CPC ........ *G01C 19/5684* (2013.01); *B81C 99/003* (2013.01)

(58) Field of Classification Search
CPC .............. B81C 99/003; B81C 99/0065; G01C 19/5684; G01R 31/2894; G05B 19/41875; H01L 22/20
See application file for complete search history.

(56) References Cited

U.S. PATENT DOCUMENTS

| | | | | |
|---|---|---|---|---|
| 2009/0206987 A1* | 8/2009 | Aubin | ............... | G06K 7/10336 340/5.8 |
| 2009/0301193 A1* | 12/2009 | Schwartz | ........... | G01C 19/5684 73/504.12 |
| 2014/0025330 A1* | 1/2014 | Bhandari | ................ | G01P 21/00 702/99 |
| 2014/0083164 A1* | 3/2014 | Homeijer | ............... | G01V 1/162 73/1.82 |
| 2014/0260508 A1* | 9/2014 | Dar | ........................ | B81C 99/003 73/1.01 |
| 2015/0226557 A1* | 8/2015 | Aaltonen | ............ | G01C 19/5712 73/504.12 |
| 2016/0298963 A1* | 10/2016 | Kapusta | ............. | G01C 19/5776 |

* cited by examiner

*Primary Examiner* — Stephen W Smoot
(74) *Attorney, Agent, or Firm* — Richard T. Ogawa; Ogawa P.C.

(57) ABSTRACT

A method for a MEMS device comprises determining in a computer system, a first driving signal for the MEMS device in response to a first time delay and to a base driving signal, applying the first driving signal to the MEMS device to induce the MEMS device to operate at a first frequency, determining a second driving signal for the MEMS device in response to a second time delay and to the base driving signal, applying the second driving signal to the MEMS device to induce the MEMS device to operate at a second frequency, determining a first quality factor associated with the MEMS device in response to the first frequency and the second frequency, determining a quality factor associated with the MEMS device in response to the first quality factor, and determining whether the quality factor associated with the MEMS device, exceeds a threshold quality factor.

20 Claims, 8 Drawing Sheets

METHOD TO TEST THE QUALITY FACTOR OF A MEMS GYROSCOPE AT CHIP PROBE

CROSS-REFERENCES TO RELATED APPLICATIONS

The present application is a non-provisional of U.S. Pat App. 62/099,413, filed Jan. 2, 2015. The present application incorporates by reference, for all purposes, the following pending patent applications: U.S. patent application Ser. No. 14/158,765, filed Jan. 17, 2014, U.S. patent application Ser. No. 14/158,756, filed Jan. 17, 2014, U.S. patent application Ser. No. 14/160,549, filed Jan. 21, 2014, U.S. patent application Ser. No. 14/163,789, filed Jan. 24, 2014, and U.S. patent application Ser. No. 14/162,718, filed Jan. 23, 2014.

BACKGROUND OF THE INVENTION

The present invention is directed to MEMS (Micro-Electro-Mechanical-Systems). More specifically, embodiments of the invention provide methods for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

The present invention is directed to MEMS (Micro-Electro-Mechanical-Systems). More specifically, embodiments of the invention provide methods for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

In an embodiment, the present invention provides a method for testing a MEMS device. The method can include applying at least two driving signals to a MEMS device. Each of the driving signals causes the MEMS device to resonate at a first and second resonant frequency, respectively. The first driving signal is characterized by a first frequency and a first phase. The second driving signal is also characterized by the first frequency, but is characterized by a second phase, which has a negative phase shift relative to the first phase. A quality characteristic can then be determined in response to the at least two resonant frequencies. This quality characteristic can be compared to predetermined quality characteristic for the MEMS device. In some embodiments, based upon the comparison, the MEMS device may be placed in appropriate performance bins and/or pass/fail bins.

Many benefits are achieved by way of the present invention over conventional techniques. For example, the present techniques provide easy to use processes that rely upon conventional fabrication technologies. In some embodiments, the methods provide the ability to measure a quality factor Q, which offers a method to assess the quality of the hermetic/vacuum seal of a MEMS device. This method of automated Q measurement provides a means for screening out devices with sub-par levels of vacuum, which can lead to higher yields of better performing MEMS devices and production costs saved. Depending upon the embodiment, one or more of these benefits may be achieved.

According to one aspect of the invention, a method for a MEMS device is disclosed. One technique may include determining in a computer system, a first driving signal for the MEMS device in response to a first time delay and to a base driving signal, and applying with the computer system, the first driving signal to the MEMS device to induce the MEMS device to operate at a first frequency. A method may include determining in the computer system, a second driving signal for the MEMS device in response to a second time delay and to the base driving signal, and applying with the computer system, the second driving signal to the MEMS device to induce the MEMS device to operate at a second frequency. A process may include determining in the computer system, a first quality factor associated with the MEMS device in response to the first frequency and the second frequency, and determining in the computer system a quality factor associated with the MEMS device in response to the first quality factor. A method may include determining in the computer system whether the quality factor associated with the MEMS device, exceeds a threshold quality factor.

According to one aspect of the invention, a method for a MEMS device is described. One process may include determining in a computer system, a plurality of driving signals for the MEMS device in response to a plurality of time delays and to a base driving signal, and applying with the computer system, the plurality of driving signals to the MEMS device to induce the MEMS device to operate at a plurality of frequencies, wherein each time delay from the plurality of time delays has a one to one associative relationship to a frequency from the plurality of frequencies. A method may include determining in the computer system, a plurality of phases in response to the plurality of time delays and the plurality of frequencies, wherein each of the plurality of time delays has a one to one associative relationship to a phase from the plurality of phases, and determining in the computer system, a first quality factor associated with the MEMS device in response to the plurality of phases and in response to the plurality of frequencies. A technique may include determining in the computer system, a quality factor associated with the MEMS device in response to the first quality factor, and determining whether the quality factor associated with the MEMS device exceeds a threshold quality factor.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1:
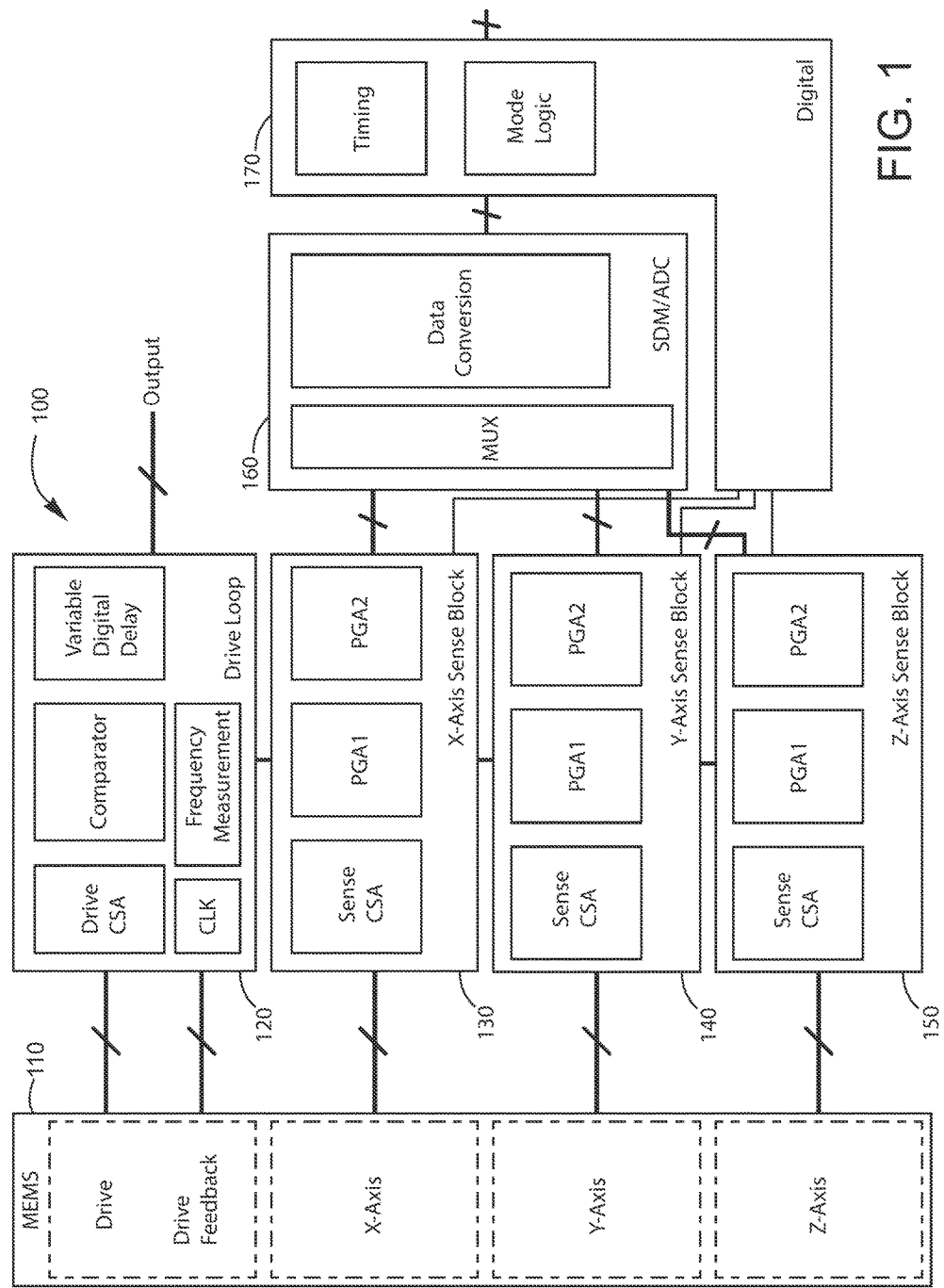
FIG. 1 is a simplified diagram illustrating an integrated MEMS CMOS device according to an embodiment of the present invention.

The present invention is directed to MEMS (Micro-Electro-Mechanical-Systems). More specifically, embodiments of the invention provide methods for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

According to a specific embodiment, the present invention provides a method for testing a MEMS inertial sensor, such as a MEMS gyroscope. A MEMS gyroscope includes drive and sense resonators, which are second order underdamped systems. The drive resonator is usually operated at resonance to maximize drive displacement and hence the Coriolis displacement and sensitivity of the gyroscope. The amplitude of the drive displacement is proportional to the quality factor (Q) of the drive resonator. Q depends on the amount of mechanical dissipation occurring due to the drive resonator's mass colliding with entrapped air molecules (referred to as gas/fluid damping) within the hermetically/vacuum sealed MEMS device. The greater the number of molecules, the greater the dissipation and lower the Q. Hence, the measurement of Q offers a method to assess the quality of the hermetic/vacuum seal. It is especially useful at wafer level chip-probe, since an automated measurement of Q offers a method to discard devices with sub-par levels of vacuum.

One of the definitions of the quality factor of a second order system is in terms of resonant frequency and bandwidth:

$$Q = \frac{f_0}{(f_H - f_L)}$$

where, Q=quality factor, $f_0$=resonant frequency, $f_H$=upper 3-dB frequency, $f_L$=lower 3-dB frequency. By measuring $f_0$, $f_H$ and $f_L$, Q can be obtained.

In an embodiment, the present invention provides a method for measuring $f_0$. At resonance, the phase-shift between the drive voltage and drive displacement of a capacitively-driven MEMS resonator is −90 degrees. The drive displacement is converted to a capacitance change by the drive-feedback sense capacitor within the MEMS device. This capacitance change is converted to a voltage by a charge sense amplifier (CSA) for the drive resonator (drive CSA) by CMOS front-end circuitry.

In order to cause the resonator to oscillate at $f_0$ a positive feedback needs to be created. This can be accomplished by creating an additional phase shift of +90 degrees within the CMOS circuitry either by using an RC analog phase shifter or a digital delay circuit. Now, the total phase shift=0 degrees and the MEMS resonator will oscillate at $f_0$.

In an embodiment, the present invention provides methods for measuring $f_H$ and $f_L$. In order to cause the resonator to oscillate at $f_H$ or $f_L$, a phase shift of either 45 degrees or 135 degrees needs to be generated by the CMOS circuitry. The following figures depict an example integrated MEMS CMOS device configured to measure these desired frequencies.

In an embodiment, the present invention provides a method for an integrated MEMS-CMOS device. The method includes providing a MEMS device coupled to a variable delay module and a frequency measurement module. These modules are then used to determine three target frequencies in order to determine a quality characteristic of the MEMS device.

The method can include determining, by the frequency measurement module, a first target frequency associated with the MEMS device, wherein determining the first target frequency includes applying a first driving signal to the MEMS device to determine the first target frequency having a resonant phase, wherein the first driving signal includes a first frequency and a first phase.

The method can also include determining, by the frequency measurement module, a second target frequency associated with the MEMS device, wherein determining the second target frequency includes applying a second driving signal to the MEMS device to cause the MEMS device to resonate at the second target frequency, wherein the second driving signal includes the first frequency and a second phase, wherein the second phase has a negative phase shift relative to the first phase.

The method can also include determining, by the frequency measurement module, a third target frequency associated with the MEMS device, wherein determining the third target frequency includes applying a third driving signal to the MEMS device to cause the MEMS device to resonate at the third target frequency, wherein the third driving signal includes the first frequency and a third phase, wherein the third phase has a positive phase shift relative to the first phase. Then, a quality characteristic associated with the MEMS device can be determined using the first target frequency, the second target frequency, and the third target frequency.

FIG. 1 is a simplified diagram illustrating an integrated MEMS CMOS device according to an embodiment of the present invention. As shown, system 100 includes a MEMS device 110 coupled various blocks of integrated circuitry, which can be CMOS integrated circuitry. The MEMS device can include a MEMS inertial sensor, MEMS rate sensor, MEMS resonator, or the like. The MEMS device can be coupled a drive loop block 120, an X-axis sense block 130, a Y-axis sense block 140, and a Z-axis sense block 150. These XYZ sense blocks can be coupled to an SDM/ADC (Spatial Division Multiplexing/Analog-to-Digital) block 160 and a Digital block 170.

In an embodiment, MEMS device 110 can include outputs for each of the X, Y, and Z axes. As shown in block 110, each of the "Drive", "Drive Feedback" "X-axis", "Y-Axis", and "Z-Axis" regions is marked by a dotted line region and each has at least one output. Each of these regions also includes a data path. The drive and drive feedback data paths are coupled to the drive loop block 120. Each of the three axes data paths are coupled to their respective sense blocks 130, 140, and 150.

Each of these sense blocks shows a simplified representation of sense circuitry designed to process signals from the MEMS device 110. As an example, each of these sense blocks includes at least a sense CSA (Charge Sensitive Amplifier) and one or more PGAs (Programmable Gain Amplifiers). These sense blocks are coupled to each other, to the drive loop, and to the SDM/ADC and Digital blocks 160, 170. As an example, the SDM/ADC block 160 includes a MUX (multiplexer) and a data conversion block, while the digital block 170 includes a timing block and a mode logic block.

In an embodiment, the drive loop block 120 can be configured with circuitry to determine a quality characteristic of the MEMS device 110. Block 120 has a simplified representation with drive CSA, comparator, variable digital delay, clock, and frequency measurement blocks.

In a specific embodiment, the output of the drive CSA is sinusoidal and is converted to a square wave by a comparator. The output of the comparator is fed to a programmable digital delay and a frequency measurement circuit. These circuits can be configured to use a highly accurate and stable external reference clock, which is about 1000 times faster than the nominal resonant frequency of the MEMS device, to generate delays and measurement frequency outputs.

TABLE 1

Example frequency measurements

| MEMS frequency | External clock frequency | Programmed value of digital delay | Number of counts programmed to digital delay | Phase | Frequency measured |
|---|---|---|---|---|---|
| 20 kHz (50 μs) | 20 MHz (50 ns) | 12.5 μs | 12.5 μs/ 50 ns = 250 | 360° × 12.5 μs/ 50 μs = 90° | $f_0$ |
| 20 kHz (50 μs) | 20 MHz (50 ns) | 6.25 μs | 6.25 μs/ 50 ns = 125 | 360° × 6.25 μs/ 50 μs = 45° | $f_L$ |
| 20 kHz (50 μs) | 20 MHz (50 ns) | 18.75 μs | 18.75 μs/ 50 ns = 375 | 360° × 18.75 μs/ 50 μs = 135° | $f_H$ |

Table 1 shown above provides example configurations for measuring $f_0$, $f_H$ and $f_L$. Here, the MEMS nominal resonant frequency is 20 kHz with an external clock frequency of 20 MHz. The programmed value of digital delay can be used to determine the phase shift of the signals being measured. By multiplexing the drive resonator and sense resonator, both drive and sense resonant frequencies and quality factors can be measured. Those of ordinary skill in the art will recognize the application of the present invention to MEMS having other frequencies other than 20 kHz and external clock frequencies other than 20 MHz.

Figure 2A:
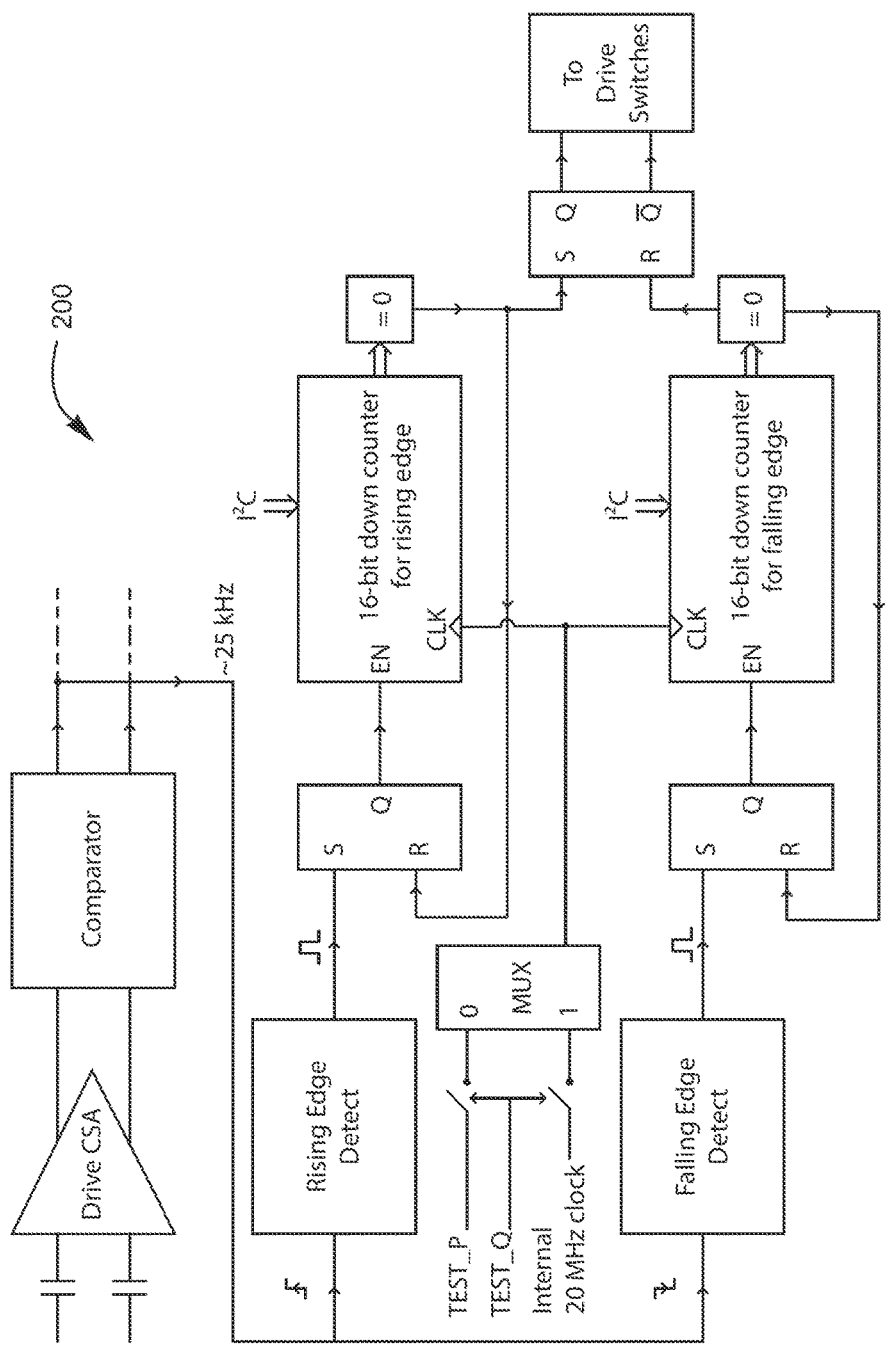
FIG. 2A is a simplified diagram illustrating a variable digital delay block according to an embodiment of the present invention.

FIG. 2A is a simplified diagram illustrating a variable digital delay block 200 according to an embodiment of the present invention. As shown, the digital delay block 200 is coupled to the comparator, which is coupled to the drive CSA. The delay block 200 includes a rising edge detect block and a falling edge detect block. Each of these edge detect blocks are coupled to a feedback loop with a 16-bit down counter configured for the designed edge detect. Both of these counters have a clock input coupled to a multiplexer, which is coupled to two test signals (P and Q in FIG. 2A), and an internal 20 MHz clock. The outputs of both these counters are coupled to drive switches.

Figure 2B:
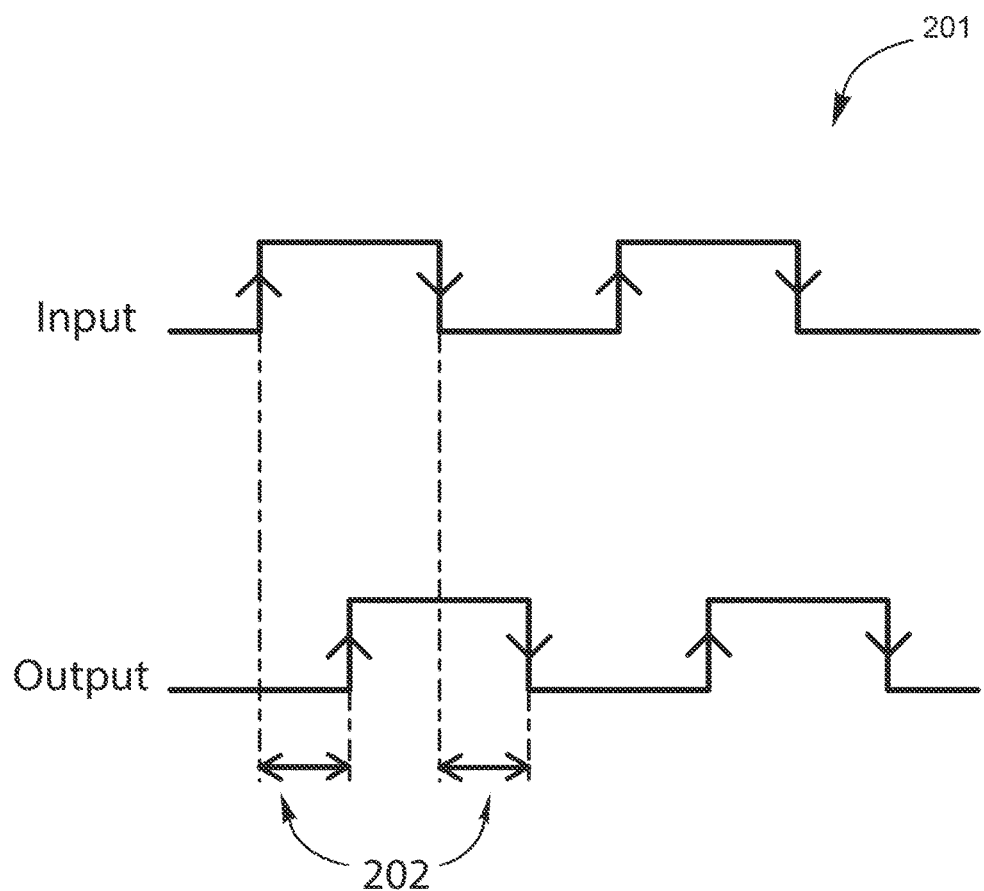
FIG. 2B is a simplified timing diagram illustrating the operation of the variable digital delay block, from FIG. 2A, according to an embodiment of the present invention.

FIG. 2B is a simplified timing diagram 201 illustrating the operation of the variable digital delay block, from FIG. 2A, according to an embodiment of the present invention. As shown, the rising and falling edges of the output trails that of the input by delay 202, which can be determined by count values writer to counters driven by a high frequency clock.

The smallest delay step is the inverse of the external clock frequency, which is 1/20 MHz=50 ns according to the embodiment described in Table 1. The worst case smallest phase step is the ratio of the smallest delay step to the smallest time period of the MEMS device. In this example, the phase step is:

$$\Phi_{step} = \frac{50 \text{ ns}}{(1/30 \text{ kHz})} \times 360° = 0.54°$$

This leads to approximately a ±2° phase error and a ±10% Q measurement error.

Figure 3A:
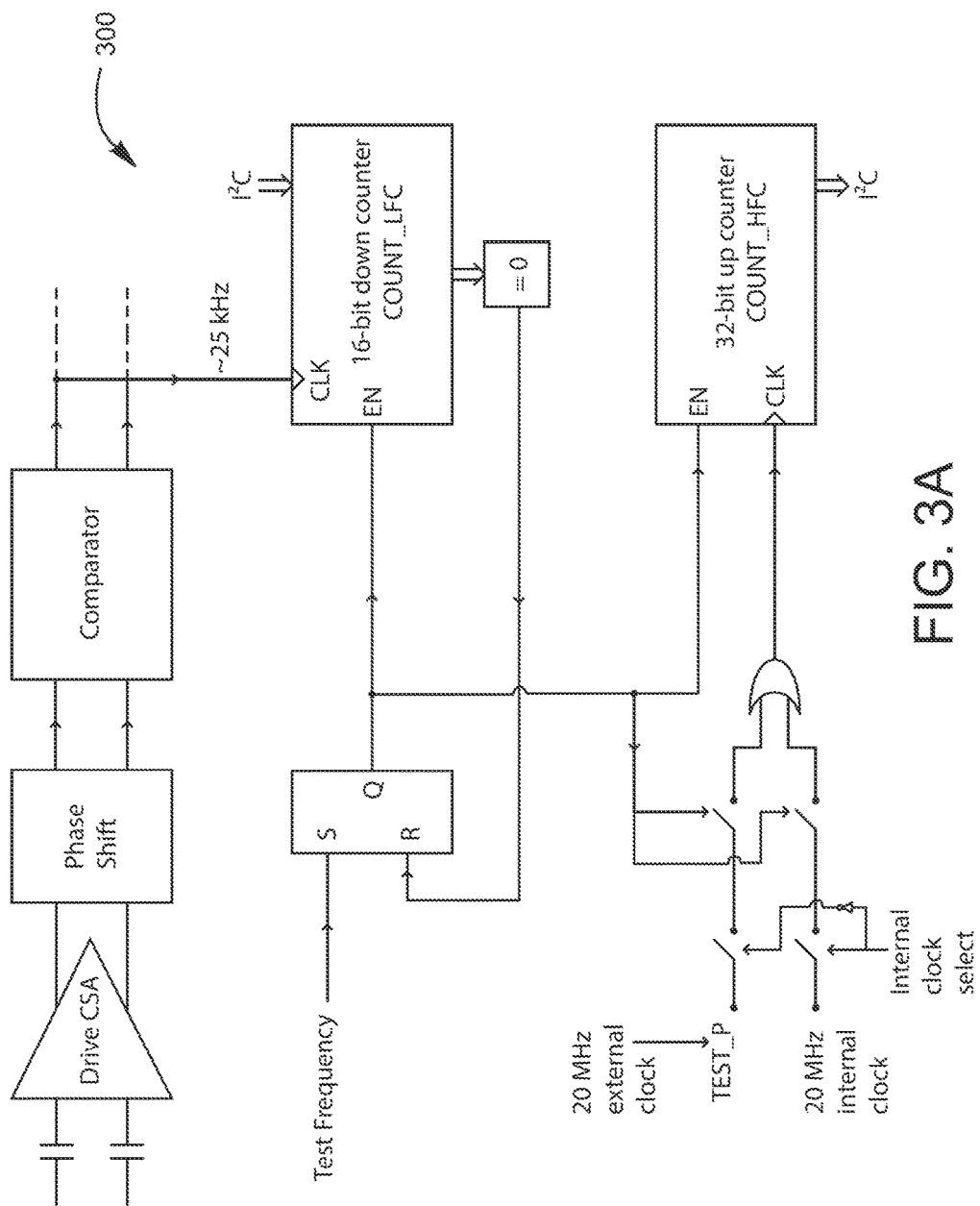
FIG. 3A is a simplified diagram illustrating a frequency measurement block according to an embodiment of the present invention.

FIG. 3A is a simplified diagram illustrating a frequency measurement block according to an embodiment of the present invention. As shown, the frequency measurement block 300 is coupled to the comparator after a phase shift block, which is coupled to the drive CSA. The phase shift block can be a 90 degree phase shift block. In an embodiment, measurement block 300 includes a 16-bit down counter for the LFC (Low Frequency Clock) signal and a 32-bit up counter for a HFC (High Frequency Clock) signal. The LFC indicates the MEMS drive frequency to be measured, while the HFC is provided by an accurate test clock.

In an embodiment, the 16-bit down counter (COUNT_LFC) is configured in a feedback loop with a test frequency. This test frequency can be set by a user and can be provided via registers or the like. The 16-bit counter receives its CLK signal from the comparator and also is given an initial value from the I²C register interface.

In an embodiment, the 32-bit up counter (COUNT_HFC) receives an input from the test frequency feedback loop and receives a clock input from an OR-gate of clock inputs. The OR gate is controlled by an internal clock select multiplexer, which chooses between an external clock or an internal clock. In this example, the selection is between a 20 MHz external clock and a 20 MHz internal clock. Furthermore, the count value of the 32-bit counter is read by the I²C interface.

Figure 3B:
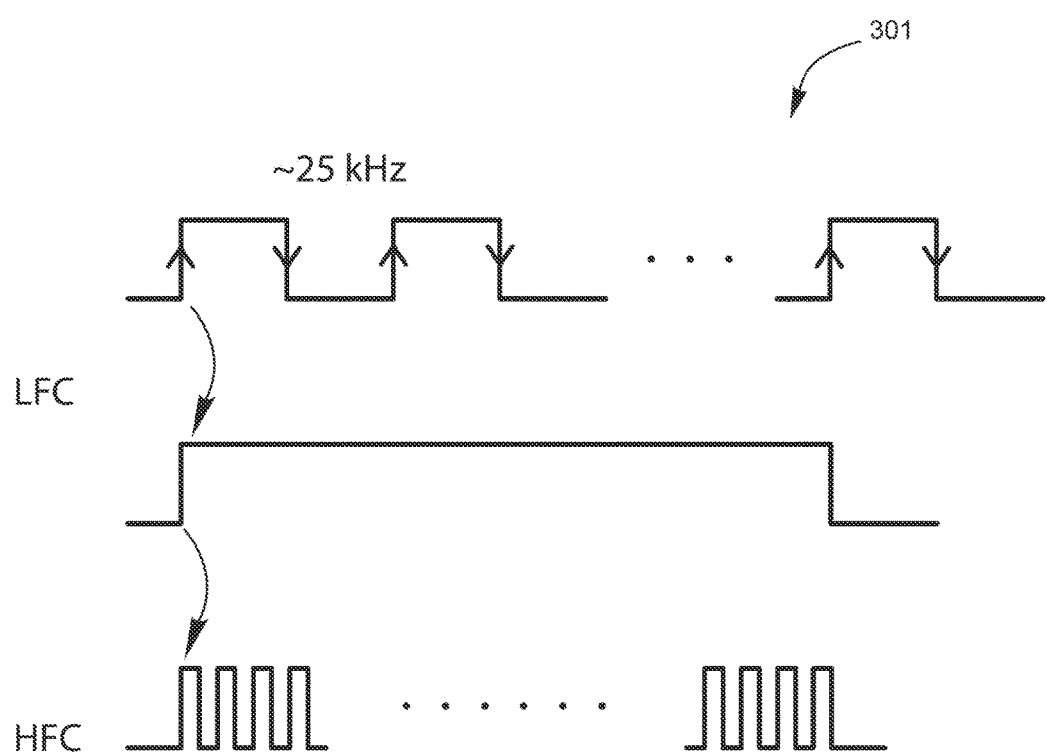
FIG. 3B is a simplified timing diagram illustrating the operation of the frequency measurement block, from FIG. 3A, according to an embodiment of the present invention.

FIG. 3B is a simplified timing diagram illustrating the operation of the frequency measurement block, from FIG. 3A, according to an embodiment of the present invention. As shown, the timing diagram includes the LFC signal and a HFC signal. As stated previously, the LFC indicates the MEMS drive frequency to be measured, while the HFC is provided by an accurate test clock. The HFC waveform is scaled to the middle waveform form, which is a close up of the top waveform. Here, the measured frequency can be provided as follows:

$$f_{LFC} = f_{HFC} \times \left(\frac{COUNT\_LFC}{COUNT\_HFC}\right)$$

In an embodiment, the present invention provides a method for determining a quality factor of a MEMS device. The method can include providing initial drive signals to the MEMS device and measuring the drive feedback. The drive feedback is 90 degrees shifted after the initial drive signals via the drive CSA, which allows the use of a 90 degree phase shifter to sync the phases of the initial drive signals and the drive feedback. The square wave comparator takes the feedback signals and feeds them back to the drive circuit. Eventually, the circuit signal will settle at a resonant frequency $f_0$. The drive feedback can then be modified to be +/−45 degrees from the drive signals, causing the MEMS device to resonate at frequencies $f_H$ and $f_L$. As discussed previously, quality characteristic Q can be obtained measuring $f_0$, $f_H$ and $f_L$. Those of ordinary skill in the art will recognize other variations, modifications, and alternatives.

Many benefits are achieved by way of the present invention over conventional techniques. For example, the present techniques provide easy to use processes that rely upon conventional fabrication technologies. In some embodiments, the methods provide the ability to measure a quality factor Q, which offers a method to assess the quality of the hermetic/vacuum seal of a MEMS device. This method of automated Q measurement provides a means for screening out devices with sub-par levels of vacuum, which can lead to higher yields of better performing MEMS devices and production costs saved. Depending upon the embodiment, one or more of these benefits may be achieve.

Figure 4A:
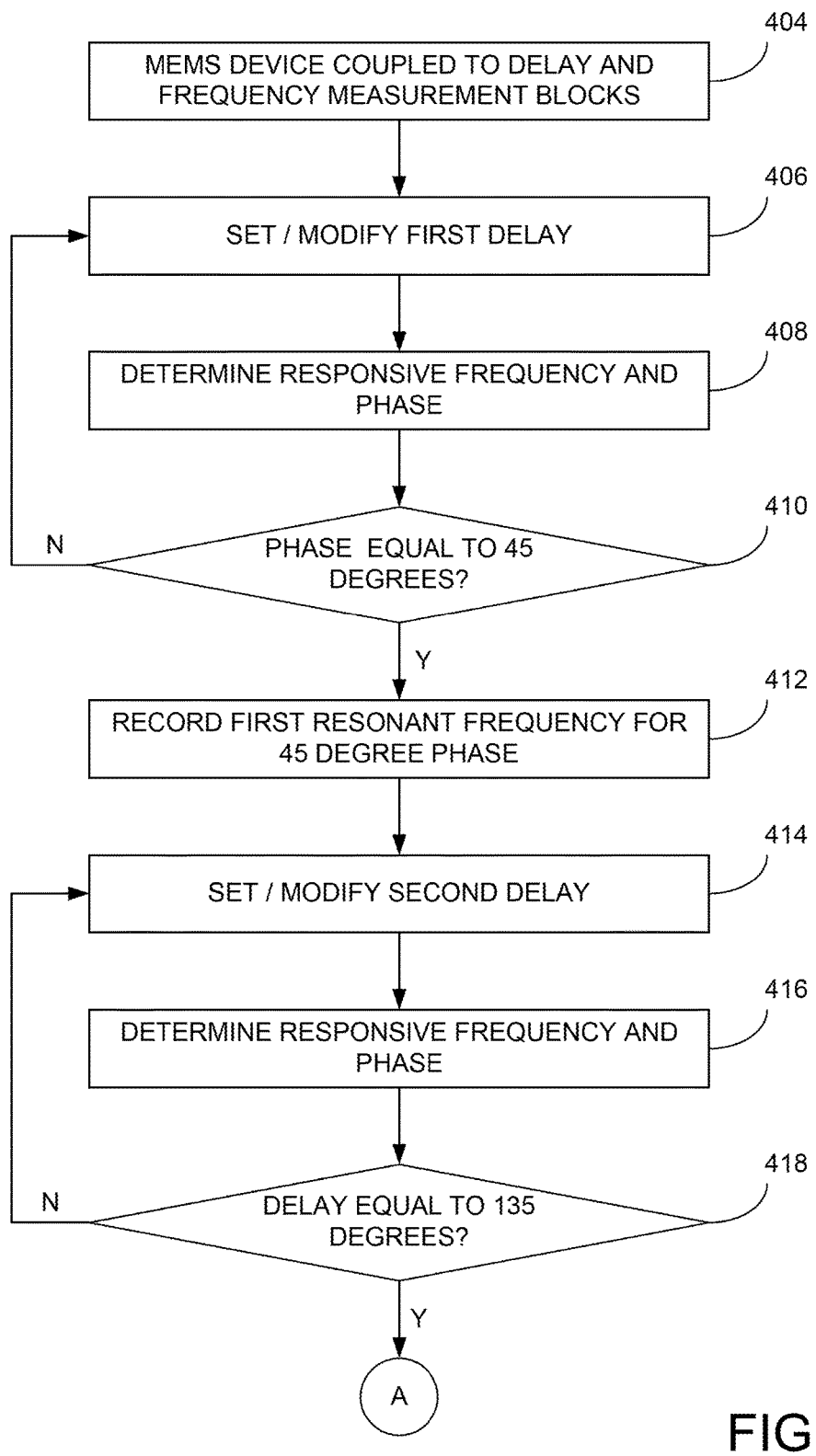
FIGS. 4A-4C are a simplified flow diagram illustrating a method for a MEMS device according to an embodiment of the present invention.
Figure 4B:
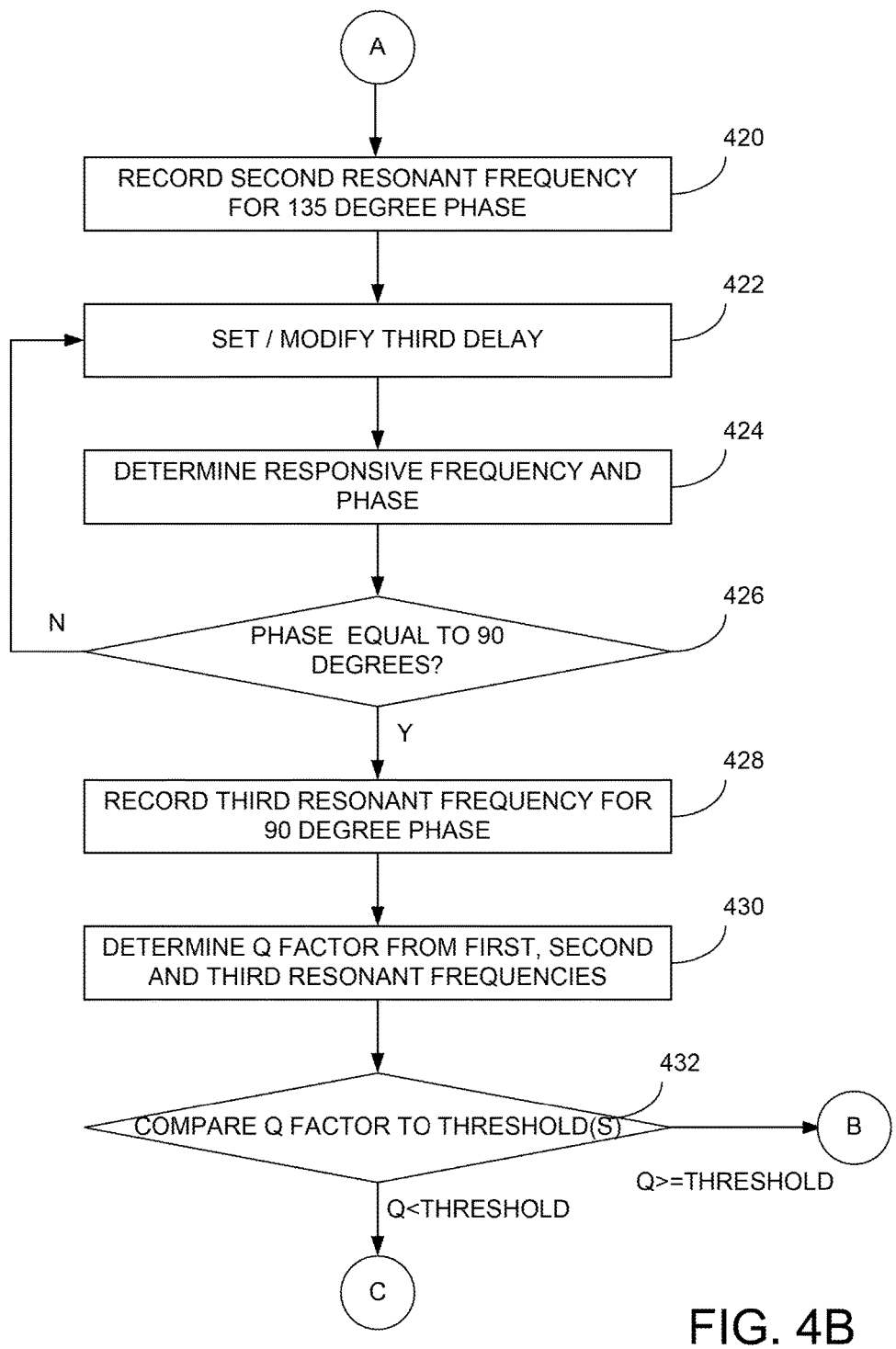
Figure 4C:
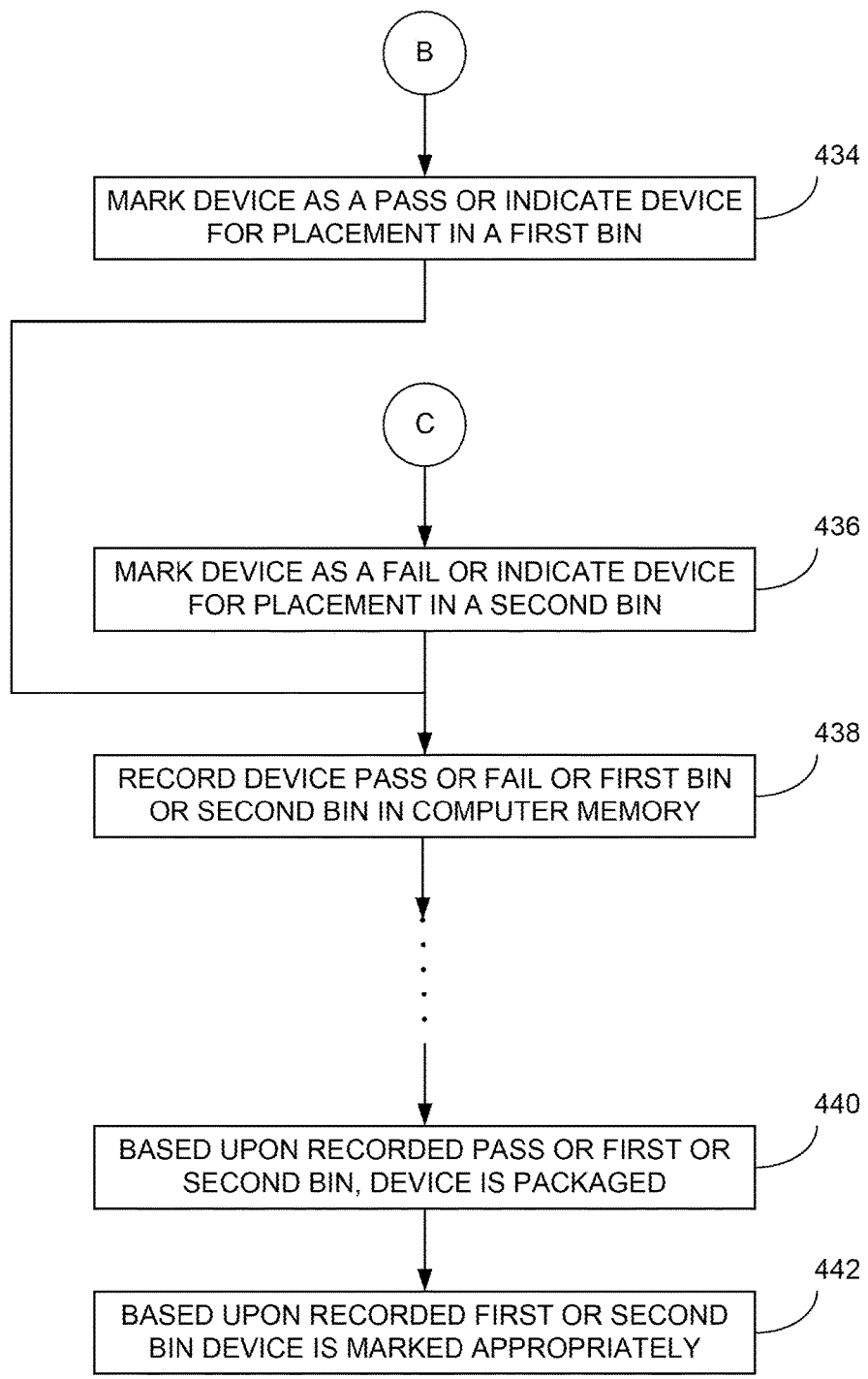

FIGS. 4A-C are a simplified flow diagram illustrating a method for a MEMS device according to an embodiment of the present invention. In a specific embodiment, this method includes determining a quality factor Q of a MEMS resonator device. As shown in FIG. 4, the present method can be briefly outlined below.
  1. Start;
  2. Provide a MEMS device coupled to a variable digital delay block and a frequency measurement block;
  3. Apply an initial drive signal having an initial phase to a MEMS device;
  4. Determine an initial response frequency having an initial response phase;
  5. Modify drive signal until phase is equal to 45 degrees;
  6. Determine first resonant frequency associated with 45 degree phase;
  7. Modify drive signal until phase is equal to 135 degrees;
  8. Determine second resonant frequency associated with 135 degree phase;
  9. Modify drive signal until phase is equal to 90 degrees;
  10. Determine third resonant frequency for device associated with 90 degree phase;
  11. Determine Q based upon the first resonant frequency, the second resonant frequency and the third resonant frequency;
  12. Compare Q for device with one or more thresholds;
  13. Mark pass or fail for device (or appropriate bin) based upon Q threshold comparisons;
  14. Store Q, Pass/Fail, and/or binning information in memory.

These steps are merely examples and should not unduly limit the scope of the claims herein. As shown, the above method provides a way of determining a Q factor for a MEMS device, which can be used to assess the quality of the hermetic/vacuum seal provided in the MEMS device. In one example, the first phase, the second phase, and the third phase are selected from a group, without replacement, of: 45 degrees, 90 degrees, and 135 degrees. In some embodiments, to obtain a specific phase such as 45 degrees, an initial drive signal is repeatedly modified, until a first computed phase is 45 degrees (associated with a first frequency); to obtain a specific phase such as 135 degrees, the initial drive signal is also repeatedly modified, until the second computed phase is 135 degrees (associated with a second frequency;); and to obtain a specific phase such as 90 degrees, the initial drive signal is also repeatedly modified, until the third computed phase is 90 degrees (associated with a resonant frequency). Continuing this example, the Q factor may be determined based upon the first frequency, the second frequency, and the resonant frequency. In another example, a first phase is 90 degrees and the second phase may freely be measured. For example, in some embodiments, to obtain a specific phase such as 90 degrees, an initial drive signal is repeatedly modified, until a first computed phase is 90 degrees (associated with the resonant frequency); and then a drive signal is also applied, and a second computed phase and a second frequency are determined. Next, the Q factor may be determined based upon the resonant frequency, the second frequency, and the second computed phase. One or ordinary skill in the art would recognize many other variations, modifications, and alternatives. For example, various steps outlined above may be added, removed, modified, rearranged, repeated, and/or overlapped, as contemplated within the scope of the invention.

The method described in FIGS. 4A-C. A MEMS device coupled to a variable digital delay block and a frequency measurement block can be provided, step 404. This configuration can be similar to that described in FIGS. 1-3.

In an embodiment, the method includes applying an initial drive signal having an initial phase to the MEMS device, step 406. The method also includes determining an initial response frequency having an initial response phase, step 408. The drive signal is then modified until the response phase is equal to 45 degrees, step 410. A first resonant frequency is determined when the phase is equal to 45 degrees (e.g. within a range of about 44 to 46 degrees), step 412.

In an embodiment, the method includes setting the drive signal, step 414, determining a responsive frequency and phase, step 416, until the response phase is equal to 135 degrees, step 418. A second resonant frequency is determined when the phase is equal to 135 degrees (e.g. within a range of about 134 to 136 degrees), step 420.

In an embodiment, the method includes modifying the drive signal, step 422, determining a responsive frequency and phase, step 424, until the response phase is equal to 90 degrees (e.g. within a range of about 89 to 90 degrees), step 426. A third resonant frequency is determined when the phase is equal to 90 degrees, step 428.

In various embodiments, the Q factor for the device is then computed based upon the first, second, and third resonant frequencies, step 430. The Q factor may then be compared to one or more thresholds, step 432 to determine whether the device passes/fails, or to determine which bin to place the device, steps 434 or 436. Depending upon engineering requirements, the threshold may be within a range of 1 to about 10,000. Devices with Q factors below the threshold may be marked is defective, or placed in a low quality bin, and devices exceeding the threshold may be marked as good parts, or placed in a high quality bin. In various embodiments, the Q factor, comparisons, and the like, associated with the device may be stored in a memory, step 438. For example, later in a production line, devices marked as Pass may be packaged, step 440 and Fail, may not be packaged, or the like. Further, based upon the bin determined for the device, parts may be marked with appropriate bin indicators, step 442. For example, a high Q part may be marked with a –01 suffix, and a lower Q part may be marked with a –02 suffix, and the like. Many other ways to visually indicate different bins are contemplated within the scope of embodiments of the present invention.

In alternative embodiments, the Q factor may simply be determined based upon the resonant frequency (associated with a phase of 90 degrees), and a second frequency and a second phase measured from the device, based upon a second driving signal. In such embodiments, the second phase need not be associated with 135 degrees or 45 degrees, but may be arbitrary. In some embodiments, multiple drive signals may be used, and multiple computations of Q may be determined. These values may then be averaged to determine a Q value for the device.

In another embodiment, the present invention includes a method for an integrated MEMS-CMOS device. The method can include the following steps to determine a first resonant frequency: providing a MEMS device coupled to a variable delay module and a frequency measurement module; applying an initial drive signal having an initial phase to the MEMS device; determining, by the frequency measurement module, an initial response frequency having an initial response phase; modifying, by the variable delay module, a phase of the initial response phase to a modified phase; determining a first driving signal in response to the initial response frequency and the modified phase; applying the first driving signal to the MEMS device, wherein the first driving signal comprises a first frequency and a first phase; and determining, by the frequency measurement module, a first resonant frequency caused by the application of the first driving signal to the MEMS device, wherein the first resonant frequency includes a resonant phase;

This method can include the following steps to determine a second resonant frequency: determining, by the variable delay module, a second driving signal by modifying the first phase of the first driving signal; applying the second driving signal to the MEMS device, wherein second driving signal comprises the first frequency and a second phase, wherein the second phase has a negative phase shift relative to the first phase; and determining, by the frequency measurement module, a second resonant frequency caused by the application of the second driving signal to the MEMS device.

The method can include the following steps to determine a third resonant frequency: determining, the variable delay module, a third driving signal by modifying the first phase of the first driving signal; applying the third driving signal to the MEMS device, wherein the third driving signal comprises the first frequency and a third phase, wherein the third phase has a positive phase shift relative to the first phase; and determining, by the frequency measurement module, a third resonant frequency caused by the application of the third driving signal to the MEMS device.

In an embodiment, the method can include determining a quality characteristic, step 420, for the MEMS device in response to the first, second, and third resonant frequencies. This quality characteristic can be a quality factor Q. This quality characteristic can be associated with an identifier associated with the MEMS device in a file within a computer system. The file can contain identifiers and associated quality characteristics for a plurality of MEMS device. Based on the file, the MEMS devices can be screened according to one or more thresholds or tolerance values for the quality characteristic. By monitoring the quality characteristics, mass production of such MEMS devices can be subjected to the quality characteristic threshold to filter out undesirable devices. Those of ordinary skill in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A method for a MEMS device comprises:
receiving in a variable digital delay portion of a drive loop block of the MEMS device, a first time delay;
determining with the drive loop block of the MEMS device, a first driving signal in response to the first time delay;
driving with the drive loop block of the MEMS device, drive resonators of the MEMS device in response to the first driving signal;
thereafter
sensing with a frequency measurement portion of the drive loop block of the MEMS device, a first frequency in response to the first driving signal;

receiving in the variable digital delay portion of the drive loop block of the MEMS device, a second time delay;
determining with the drive loop block of the MEMS device, a second driving signal in response to the second time delay;
driving with the drive loop block of the MEMS device, the drive resonators of the MEMS device in response to the second driving signal;
thereafter
sensing with the frequency measurement portion of the drive loop block of the MEMS device, a second frequency in response to the second driving signal;
wherein a quality factor associated with the MEMS device is determined in response to the first frequency and the second frequency.

2. The method of claim 1
wherein a first phase shift is associated with the first time delay; and
wherein a second phase shift is associated with the second time delay.

3. The method of claim 2
wherein the first phase shift is approximately equal to 90 degrees; and
wherein the first frequency comprises a resonant frequency associated with the MEMS device.

4. The method of claim 3 wherein the quality factor associated with the MEMS device is determined in response to the resonant frequency associated with the MEMS device, the second frequency, and the second phase shift.

5. The method of claim 2 wherein the first phase shift and the second phase shift are approximately 45 degrees apart.

6. The method of claim 2 further comprising:
receiving in the variable digital delay portion of the drive loop block of the MEMS device, a third time delay;
determining with the drive loop block of the MEMS device, a third driving signal in response to the third time delay;
driving with the drive loop block of the MEMS device, the drive resonators of the MEMS device in response to the third driving signal;
sensing with the frequency measurement portion of the drive loop block of the MEMS device, a third frequency in response to the third driving signal;
wherein another quality factor associated with the MEMS device is determined in response to the first frequency, the second frequency, and the third frequency.

7. The method of claim 6
wherein the first phase shift is approximately equal to 45 degrees; and
wherein the second phase shift is approximately equal to 135 degrees.

8. The method of claim 2 further comprising:
receiving in the variable digital delay portion of the drive loop block of the MEMS device, a third time delay, wherein the third time delay is associated with a third phase shift;
determining with the drive loop block of the MEMS device, a third driving signal in response to the third time delay;
driving with the drive loop block of the MEMS device, the drive resonators of the MEMS device in response to the third driving signal;
sensing with the frequency measurement portion of the drive loop block of the MEMS device, a third frequency in response to the third driving signal;
wherein another quality factor associated with the MEMS device is determined in response to the first frequency, the second frequency, the third frequency and the third phase shift.

9. The method of claim 1 further comprising:
marking the MEMS device when the quality factor associated with the MEMS device exceeds a threshold quality factor.

10. The method of claim 9 wherein the threshold quality factor is within a range of about 1 to about 10000.

11. A method for a MEMS device comprises:
receiving in a variable digital delay portion of a drive loop block of the MEMS device a plurality of time delays, wherein the plurality of time delays is associated with a plurality of respective phases;
determining with the drive loop block of the MEMS device, a plurality of respective driving signals in response to the plurality of time delays;
separately driving with the drive loop block of the MEMS device, drive resonators of the MEMS device in response to the plurality of respective driving signals;
separately sensing with a frequency measurement portion of the drive loop block of the MEMS device a plurality of respective frequencies in response to the plurality of driving signals, wherein each time delay from the plurality of time delays is associated with a frequency from the plurality of respective frequencies;
wherein a quality factor associated with the MEMS device is associated with the plurality of respective phases and the plurality of respective frequencies.

12. The method of claim 11 further comprising:
wherein a first phase from the plurality of respective phases is approximately equal to 90 degrees; and
wherein a first frequency from the plurality of respective frequencies is associated with the first phase; and
wherein the first frequency comprises a resonant frequency associated with the MEMS device.

13. The method of claim 12 further comprising:
wherein a second phase from the plurality of respective phases is approximately equal to 45 degrees; and
wherein a second frequency from the plurality of respective frequencies is associated with the second phase;
wherein a third phase from the plurality of respective phases is approximately equal to 135 degrees; and
wherein a third frequency from the plurality of respective frequencies is associated with the third phase.

14. The method of claim 11 further comprising receiving on the MEMS device, a visual mark when the quality factor associated with the MEMS device exceeds a threshold quality factor.

15. The method of claim 11 further comprising:
receiving on the MEMS device, a first visual mark, when the quality factor associated with the MEMS device is within a predetermined range of quality factors; and
wherein the first visual mark comprises a first bin indicator.

16. The method of claim 15 wherein the predetermined range of quality factors is from about 1 to about 10,000.

17. The method of claim 15 further comprising:
receiving on the MEMS device, a second visual mark when the quality factor associated with the MEMS is not within the predetermined range of quality factors; and
wherein the second visual mark comprises a second bin indicator.

18. The method of claim 11 wherein the receiving in the variable digital delay portion of the drive loop block of the MEMS device, the plurality of time delays, comprises receiving in the variable digital delay portion of the drive loop block of the MEMS device, a plurality of counts.

19. The method of claim 11 wherein the plurality of respective phases are approximately 2 degrees apart.

20. The method of claim 11 wherein the MEMS device is selected from a group consisting of: an accelerometer, a pressure sensor, and a gyroscope.

* * * * *